United States Patent [19]
Kato

[11] Patent Number: 4,747,159
[45] Date of Patent: May 24, 1988

[54] RF MODULATOR

[75] Inventor: Masashi Kato, Kakuda, Japan

[73] Assignee: Alps Electric Co., Ltd., Japan

[21] Appl. No.: 887,906

[22] Filed: Jul. 18, 1986

[30] Foreign Application Priority Data

Jul. 24, 1985 [JP] Japan .............................. 60-113354[U]
Jul. 24, 1985 [JP] Japan .............................. 60-113355[U]

[51] Int. Cl.⁴ ...................... H01Q 11/02; H03Q 3/20
[52] U.S. Cl. .................................... 455/116; 330/129; 330/135; 331/109
[58] Field of Search ...................... 455/116, 110, 117; 358/186, 143, 341; 330/129, 285, 130, 135; 331/182, 109, 161

[56] References Cited

U.S. PATENT DOCUMENTS 3,500,224  3/1970  Greeson, Jr. ........................ 330/130
4,286,336  8/1981  Sanford ............................. 455/117

Primary Examiner—Michael A. Masinick
Assistant Examiner—Curtis Kuntz
Attorney, Agent, or Firm—Guy W. Shoup

[57] ABSTRACT

An RF modulator is characterized by a gain adjusting circuit for gain adjustment incorporated with an RF amplifier for amplifying a carrier wave provided from a carrier oscillator and applying the same to a video signal modulator and to an audio signal mixer so that the gain of the RF amplifier is adjustable so as to adjust a difference in level of the carrier wave provided differently depending upon a resonance element being connected to the carrier oscillator.

4 Claims, 4 Drawing Sheets

RF MODULATOR

BACKGROUND OF THE INVENTION

1. Field of the Invention

This invention relates to an RF modulator for converting an output signal, for example, of a magnetic picture recording device into a signal adapted for inputting into a television set.

2. Description of the Prior Art

For reference, a circuit example of the conventional RF modulator formed by a one-chip IC and an surface acoustic wave resonator is shown in FIG. 4.

In FIG. 4, to resonance element connection terminals 9 and 10 of a one-chip IC 20 an elastic surface-wave resonator 30 of a given property is connected. Other than the resonance element connection terminals 9 and 10, the IC 20 is provided with ground terminals 1 and 14, audio modulation signal output terminal 2, terminal 3 for impedance matching of an audio circuit, terminals 4 and 5 for connection of an audio intercarrier tuning element, audio signal input terminal 6 to which an audio signal is applied via a pre-emphasis circuit, channel select terminal 7, power supply terminals 8 and 11, high-frequency grounding terminals 12 and 13, video modulation output terminal 15, and video signal input terminal 16. In the IC 20 there are incorporated functional blocks, such as clamp circuit 21, white clip circuit 22, video signal modulator 23, carrier oscillator 24, RF amplifier 25, audio amplifier 26, FM modulator 27, and audio signal mixer 28. Further, to respective terminals of the IC 20 peripheral circuits are connected appropriately.

In the RF modulator of the foregoing configuration, the carrier oscillator 24 oscillates in response to the resonance frequency of the surface acoustic wave resonator 30 to output a carrier wave. This carrier wave is amplified by the RF amplifier 25 and applied to the video signal modulator 23 and audio signal mixer 28. The video signal applied to the video signal input terminal 16 is processed appropriately by the clamp circuit 21 and white clip circuit 22 and applied to the video signal modulator 23, then, it amplitude-modulates the carrier wave given from the carrier oscillator 24 and the result is supplied to the video modulation signal output terminal 15. The audio signal applied to the audio signal input terminal 6 is amplified by the audio amplifier 26, converted by the FM modulator 27 into an audio-modulated FM wave, for example, of 4.5 MHz, and applied to the audio signal mixer 28. In the audio signal mixer 28, this FM wave and the carrier wave given from the carrier oscillator 24 are mixed together and output to the audio modulation signal output terminal 2.

In the conventional RF modulator incorporating the surface acoustic wave resonator 30 as shown in FIG. 4, because the frequency precision and stability of the surface acoustic wave resonator 30 are excellent, the frequency and output level of the carrier wave provided from the carrier oscillator 24 are stable. In addition, the gain of the RF amplifier 25 for amplifying the carrier wave is pre-set so that the carrier wave can be applied at the optimum level to the video signal modulator 23 and audio signal mixer 28 depending upon the given property of the surface acoustic wave resonator 30.

In the foregoing configuration, if the surface acoustic wave resonator 30 of the given property serving as the resonator is replaced by a crystal resonator of different structure, or a resonance element composed of coil and condenser, or another one of different frequency, the level and/or frequency of the carrier wave provided from the carrier oscillator 24 becomes different from that of the previous combination, and the level of the carrier wave supplied to the video signal modulator 23 and audio signal mixer 28 may or may not assume the optimum state. That is, if the input level of the carrier wave is too low the sensitivity of modulation decreases, whereas if it is too high a carrier leak arises. Particularly, due to the carrier leak there occurs incidental carrier phase modulation (ICPM). As a result, the signal-to-noise (SN) ratio and the characteristics, such as differential phase (DP) and differential gain (DG), of the RF modulator are degraded, thereby resulting in the problem that the quality of picture and of sound being reproduced, for example, in the television set is poor.

SUMMARY OF THE INVENTION

The present invention has been devised to solve the problems of the conventional RF modulator, and its object is to provide an RF modulator which incorporates a gain adjusting circuit with an RF amplifier for amplifying a carrier wave so that a difference in level of the carrier wave applied to a video signal modulator and to an audio signal mixer due to fluctuations in the characteristics of the resonance element used in the oscillator circuit, is adjustable appropriately.

To achieve the foregoing object, an RF modulator of the present invention includes a gain adjusting circuit for gain adjustment incorporated with an RF amplifier which ampifies a carrier wave provided from a carrier oscillator and applies to a video signal modulator and audio signal mixer, so that the gain of the RF amplifier can be adjusted so as to adjust a difference in level of the carrier wave provided differently depending upon a resonance element being connected to the carrier oscillator.

Accordingly, since the gain adjusting circuit for gain adjustment is incorporated with the RF amplifier for amplifying the carrier wave provided from the carrier oscillator and applying to the video signal modulator and audio signal mixer, it is possible to apply the carrier wave of the optimum level to the video signal modulator and audio signal mixer. Thus, there arises neither a decrease of modulation sensitivity nor a carrier leak even if the carrier wave is excessive or deficient, particularly, residual carrier phase modulation (ICPM) due to the carrier leak does not appear. Consequently, the signal-to-noise (SN) ratio and the characteristics, such as differential phase (DP) and differential gain (DG), of the RF modulator can be improved, and the quality of picture and of sound being reproduced, for example, in the television set can be made excellent.

DESCRIPTION OF THE PREFERRED EMBODIMENTS

Figure 1:
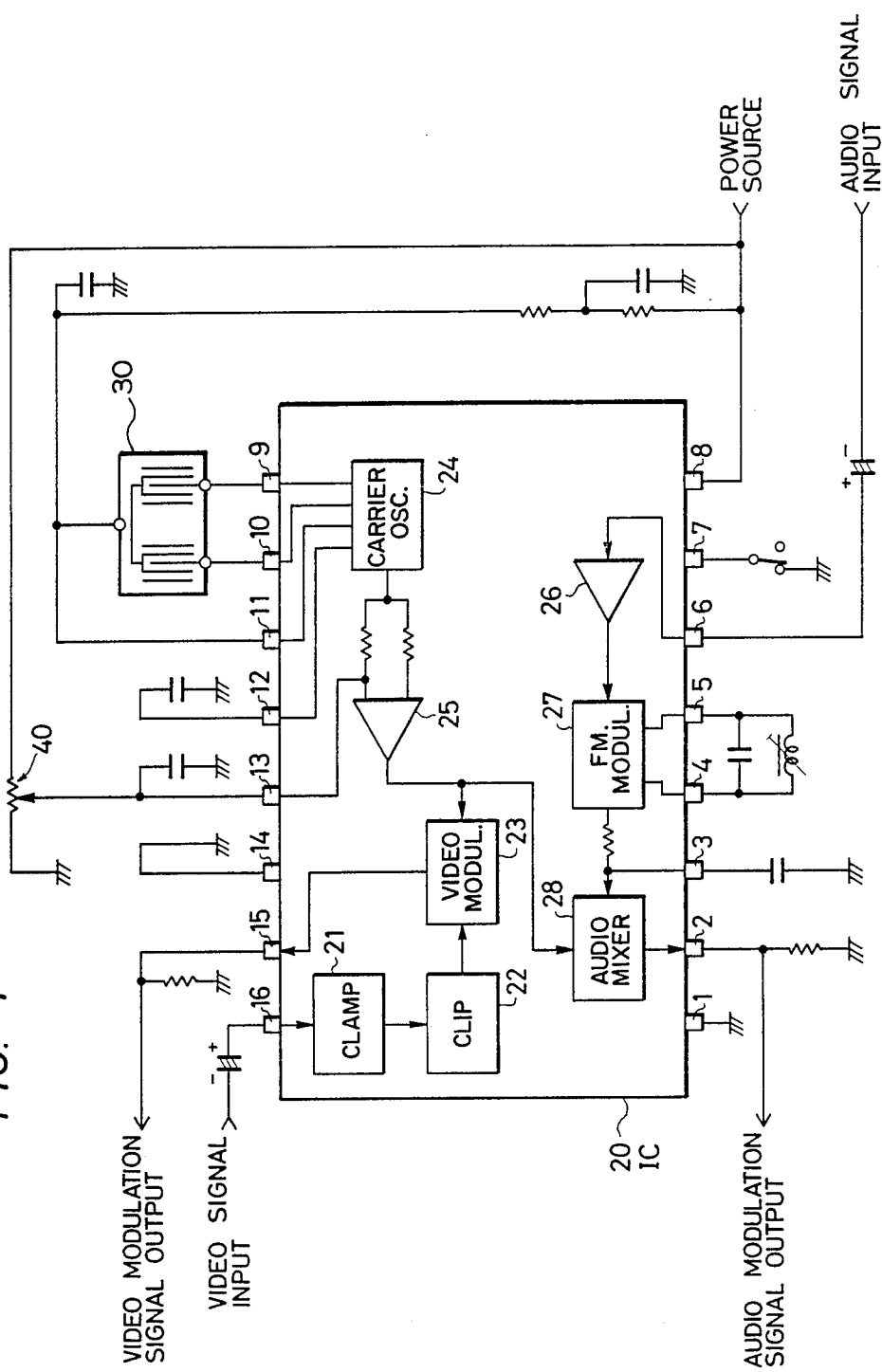
FIG. 1 is a circuit diagram of an embodiment of an RF modulator according to the present invention.
Figure 2:
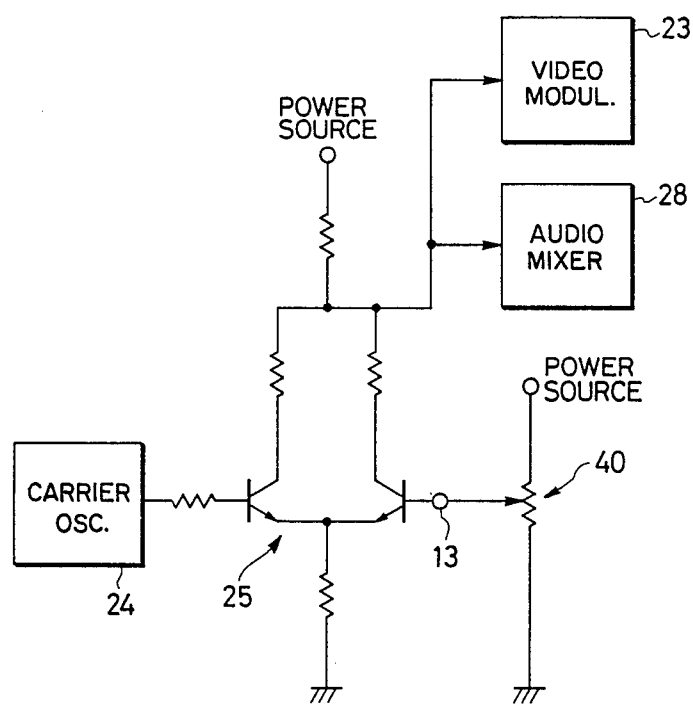
FIG. 2 is a circuit diagram showing the principles of an RF amplifier and gain adjusting circuit shown in FIG. 1.

An embodiment of an RF modulator according to the present invention will now be described with reference to FIGS. 1 and 2. FIG. 1 is a circuit diagram of one embodiment of the present invention and FIG. 2 is a circuit diagram showing the principles of an RF amplifier and gain adjusting circuit shown in FIG. 1. In FIGS. 1 and 2, the same or identical elements to those of FIG. 4 are indicated by the same reference numerals and their descriptions will not be given here again.

Figure 4:
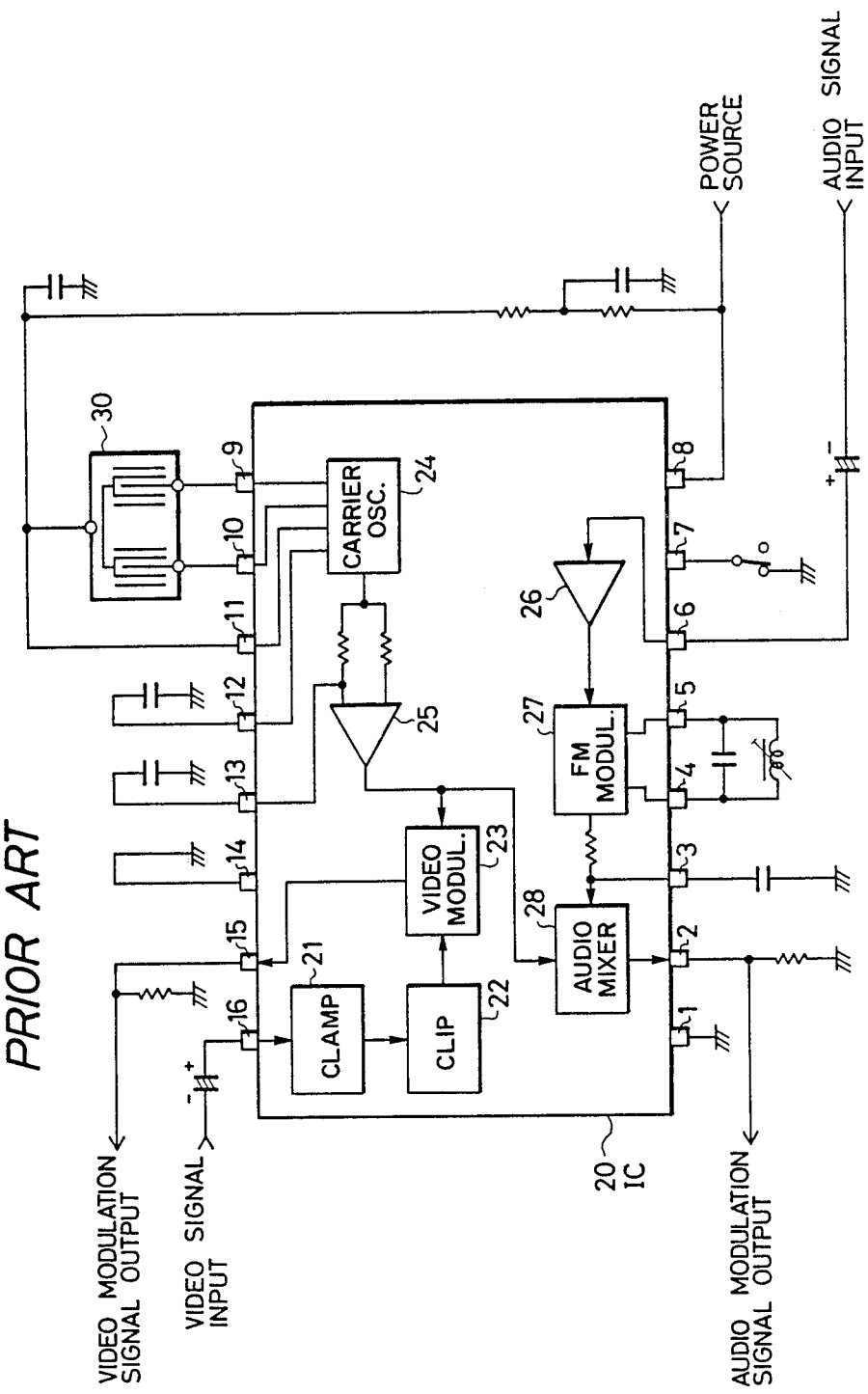
FIG. 4 is a circuit diagram of the conventional RF modulator incorporating an surface acoustic wave resonator of a given property.

The different point of the configuration shown in FIG. 1 from the conventional RF modulator shown in FIG. 4 is that a gain adjusting circuit 40 is coupled to the high-frequency grounding terminal 13 which is the outer terminal led out in order to ground the RF amplifier 25 in a sense of high frequency. This gain adjusting circuit 40 is a variable resistor coupled so that its ends are connected respectively to a power source and the earth with the midway point connected to the high-frequency grounding terminal 13, and functions as a d.c. bias circuit capable of setting an appropriate d.c. bias on the high-frequency grounding terminal 13. As shown in FIG. 2, in principle, the gain adjusting circuit 40 adjusts the bias of the base terminal of one transistor of the RF amplifier 25 formed by a differential amplifier circuit composed of two transistors, thereby to adjust the gain of the RF amplifier 25.

In the foregoing configuration, if the resonance element connected between the resonance element connection terminals 9 and 11 is replaced by another element and when the level and frequency of the resonance wave become different from those of the surface acoustic wave resonator 30 given thereby causing the output level and the like of the carrier wave provided from the carrier oscillator 24 to change, it is possible, by adjusting the gain of the RF amplifier 25 by means of the gain adjusting circuit 40, to adjust a difference in level of the carrier wave provided from the carrier oscillator 24 so as to assume the optimum level, and to apply the same to the video signal modulator 23 and audio signal mixer 28. As is apparent from the foregoing, by causing the carrier wave to be applied at the optimum level to the video signal modulator 23 and audio signal mixer 28, a decrease of modulation sensitivity resulting if the carrier level becomes excessively small does not arise, and a carrier leak resulting if that level becomes excessively large does not arise. Especially, incidental carrier phase modulation (ICPM) tending to arise as the result of the carrier leak does not occur. Therefore, it is possible to improve the signal-to-noise (SN) ratio and the characteristics, such as differential phase (DP) and differential gain (DG), of the RF modulator, it is possible to realize an excellent function identical to that of the conventional RF modulator incorporating the surface acoustic wave resonator 30 of the given property, and it is possible to make excellent the quality of picture and of sound being reproduced in the television set and the like.

Figure 3:
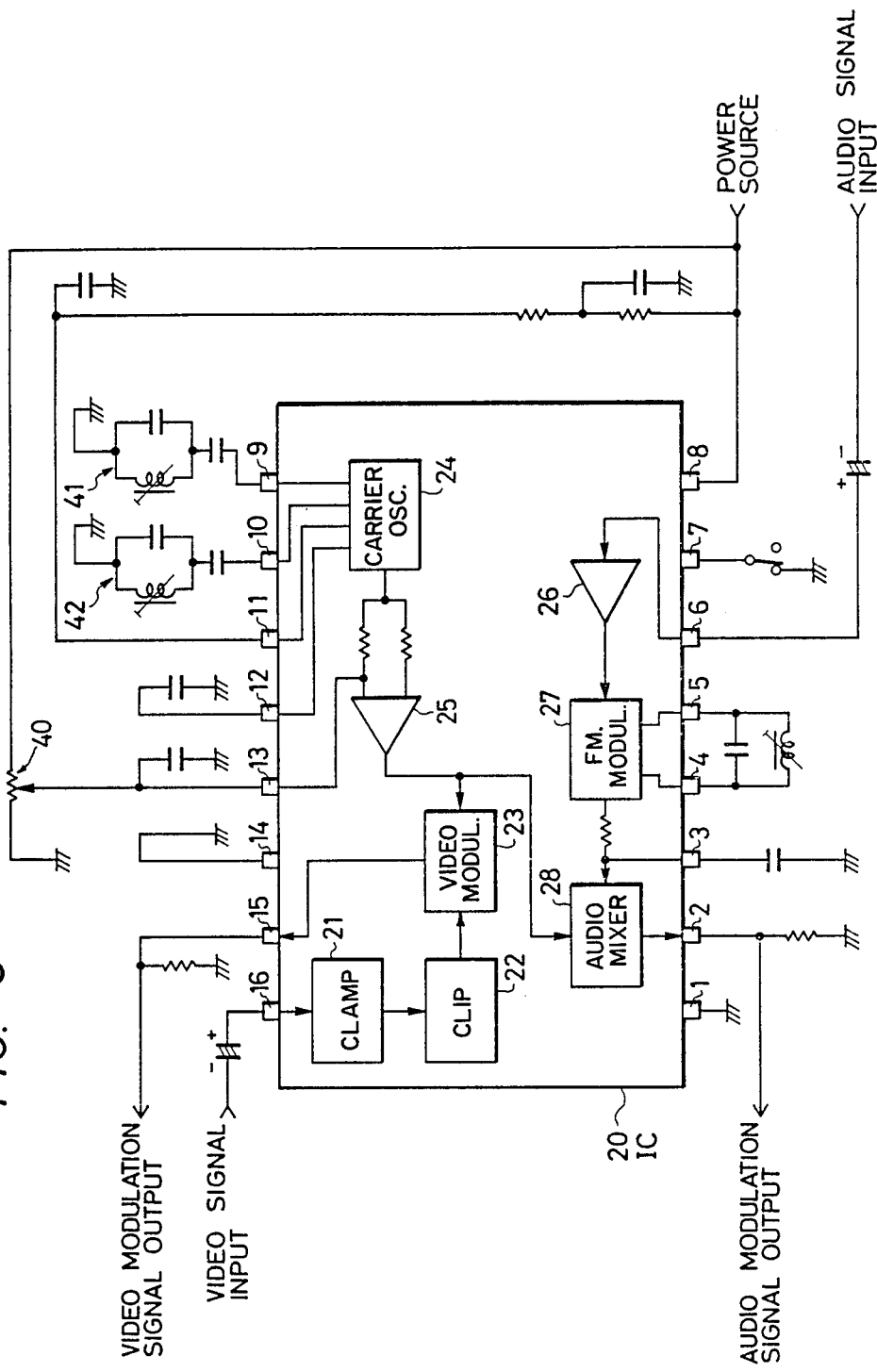
FIG. 3 is a circuit diagram showing another embodiment.

FIG. 3 shows another embodiment of the RF modulator according to the present invention. The different point of FIG. 3 from the configuration of FIG. 1 is that to the resonance element connection terminals 9 and 10 of the IC 20, resonance elements 41 and 42 each composed of a coil and condenser are connected respectively. Apparently, the resonance frequency each of these resonance elements 41 and 42 is adjustable by changing appropriately the value of coil or condenser. For reference, FIG. 3 illustrates the coils of the type whose inductance is changeable to adjust the resonance frequency.

In the foregoing configuration, since the resonance elements 41 and 42 are formed by coils and condensers, these elements can be produced at a low cost, so that the RF modulator as a whole is priced low. In addition, by adjusting the value of the coil or condenser it is possible to adjust easily the resonance frequency of the resonance element 41, 42, thereby to adjust easily at a high degree of precision the frequency of the carrier wave, thereby to realize a function identical to that of the conventional RF modulator incorporating the surface acoustic wave resonantor.

As described hereinabove, the RF modulator according to the present invention incorporates the gain adjusting circuit for gain adjustment with the RF amplifier for amplifying the carrier wave provided from the carrier oscillator and applying the same to the video signal modulator and audio signal mixer; thus, it is possible to apply the carrier wave of the optimum level to the vdieo signal modulator and audio signal mixer. Accordingly, neither a decrease of modulation sensitivity nor a carrier leak resulting if the carrier wave becomes excessively small or large arises, especially, incidental carrier phase modulation (ICPM) due to a carrier leak does not occur. Thus, there results in the effect that the signal-to-noise (SN) ratio and the characteristics, such as differential phase (DP) and differential gain (DG), of the RF modulator can be improved and the quality of picture and of sound being reproduced in the television set and the like can be made excellent.

What is claimed is:

1. In an RF modulator, for converting video and audio signal inputs to modulated video and audio signal outputs, having a resonance element for generating a resonance signal of a given frequency, and a modulator circuit including a carrier oscillator connected to the resonance element for receiving the resonance signal and providing a carrier wave output, an RF amplifier connected to the carrier oscillator for amplifying the level of the carrier wave output, a video signal modulator connected to the RF amplifier for modulating the video signal input with the amplified carrier wave output to provide the modulated video signal output, and an audio signal mixer connected to the RF amplifier for mixing the amplified carrier wave output with a frequency modulated audio signal generated from the audio signal input to provide the modulated audio signal output, the improvement comprising a gain adjusting circuit connected to said RF amplifier for adjusting a gain of the RF amplifier to thereby adjust the level of the amplified carrier wave output provided by the RF amplifier if the resonance element is changed so as to have a different resonance signal characteristic.

2. An RF modulator according to claim 1, wherein said modulator circuit is incorporated in an IC chip, said RF amplifier includes a differential amplifier circuit and a base terminal for adjusting a bias of the differential amplifier circuit, said base terminal of said RF amplifier is connected to a high frequency grounding terminal of said IC chip, and said gain adjusting circuit is a variable resistor outside of said IC chip having its ends coupled between ground and a power source and its variable contact connected to said high frequency grounding terminal of said IC chip.

3. An RF modulator according to claim 1, wherein the resonance element of said carrier oscillator is formed by coil and condenser.

4. An RF modulator according to claim 2, wherein said gain adjusting circuit is a d.c. bias circuit for setting the bias of said RF amplifier.

* * * * *